United States Patent [19]
Petit

[11] Patent Number: 5,959,355
[45] Date of Patent: Sep. 28, 1999

[54] SEMICONDUCTOR PACKAGE HAVING MECHANICALLY AND ELECTRICALLY BONDED SUPPORTIVE ELEMENTS

[75] Inventor: Luc Petit, Fontaine, France

[73] Assignee: SGS-Thomson Microelectronics S.A., Saint Genis, France

[21] Appl. No.: 08/954,696

[22] Filed: Oct. 20, 1997

[30]   Foreign Application Priority Data

Oct. 30, 1996 [EP] European Pat. Off. .............. 96410112

[51] Int. Cl.⁶ .................................................. H01L 23/48
[52] U.S. Cl. .......................................... 257/737; 257/772
[58] Field of Search ..................................... 257/737, 772

[56]   References Cited

U.S. PATENT DOCUMENTS

| | | | |
|---|---|---|---|
| 4,914,057 | 4/1990 | Gloton | 437/193 |
| 5,014,111 | 5/1991 | Tsuda et al. | 357/68 |
| 5,090,119 | 2/1992 | Tsuda et al. | 29/843 |
| 5,466,635 | 11/1995 | Lynch et al. | 437/183 |
| 5,468,995 | 11/1995 | Higgins, III | 257/697 |
| 5,525,834 | 6/1996 | Fischer et al. | 257/691 |
| 5,641,990 | 6/1997 | Chiu | 257/737 |
| 5,714,803 | 2/1998 | Queyssac | 257/738 |
| 5,751,068 | 5/1998 | McMahon et al. | 257/774 |
| 5,767,580 | 6/1998 | Rostoker | 257/738 |
| 5,796,169 | 8/1998 | Dockerty et al. | 257/738 |

FOREIGN PATENT DOCUMENTS

| | | |
|---|---|---|
| 0 724 289 A2 | 7/1996 | European Pat. Off. . |
| 2 722 916 | 1/1996 | France . |

OTHER PUBLICATIONS

English Language European Search Report dated Mar. 27, 1997 (3 pages).
European Search Report from European patent application No. 96410112, filed Oct. 30, 1996.
Patent Abstract of Japan, vol. 008, No. 155, Jul. 19, 1984 and JP 59058843, invented by Inoue Yukihiro, publication date Apr. 4, 1984.

*Primary Examiner*—Tom Thomas
*Assistant Examiner*—Ori Nadav
*Attorney, Agent, or Firm*—Wolf, Greenfield & Sacks, P.C.

[57]   ABSTRACT

A semiconductor package having an array of solder pads and supportive elements that are mechanically and electrically bonded to the solder pads and that do not collapse during the bonding process, wherein the supportive elements are annular.

13 Claims, 2 Drawing Sheets

SEMICONDUCTOR PACKAGE HAVING MECHANICALLY AND ELECTRICALLY BONDED SUPPORTIVE ELEMENTS

BACKGROUND OF THE INVENTION

1. Field of the Invention

The present invention relates to semiconductor packaging. One example of an application where this present invention may be practiced is on grid array semiconductor packages.

2. Background Art

The following figures which illustrate the various embodiments of the background art and the present invention may incorporate the same or similar elements. Therefore, where the same or similar elements occur throughout the various figures, they will be designated in the same manner.

A Ball Grid Array (BGA) semiconductor package has mechanical and electrical external connections that are made via ball-like solid solder that attach to an array of solder pads both upon the BGA package and upon the medium, hereinafter referred to as the substrate or receiving substrate, to which the BGA package is to be electrically and mechanically attached.

FIG. 1 illustrates the cross section of part of a BGA package and receiving substrate, together with the cross section of a solder ball, as known in the art.

The ball of solid solder 100, that is actually illustrated as a solid hemispherical solder ball, is attached to a solder pad 110, which in turn attached to the lower surface of a BGA package 120. Also shown in this figure is the receiving substrate 130 together with an attached solder pad 140.

The U.S. Pat. No. 5,241,133, MULLEN III et al, entitled 'LEADLESS PAD ARRAY CHIP CARRIER' illustrates an example of a typical EGA semiconductor package.

For plastic EGA packages, i.e. EGA packages wherein the integrated circuit is protected by an epoxy resin, the solder balls are typically implemented using a tin-lead (Sn-Pb) alloy having a respective 63–37 weight percentage or a tin-lead-silver (Sn-Pb-Ag) alloy having a respective 62-36-2 weight percentage.

The method of attaching solder balls to both the BGA package and the receiving substrate basically involves a thermal step which causes the solder ball to melt, known in the art as reflow, such attachment being known to those skilled in the art.

For ceramic EGA packages, which are heavier than an equivalent plastic BGA package, the solder balls are typically implemented using a tin-lead (Sn-Pb) alloy having a respective 10–90 weight percentage. The attachment of these types of solder balls is assisted by the addition of a solder cream, that typically comprises a flux and a Sn-Pb-Ag (62-36-2) alloy, that assists in the softening and diffusion of the solder ball. Solder has a melting range from approximately 179° C. (solidus) to 380° C. (liquidus), depending upon the composition of the solder.

U.S. Pat. No. 5,525,834, Fischer et al, entitled 'INTEGRATED CIRCUIT PACKAGE' discloses a BGA package that has solder balls with a 90% Pb—10% Sn solder alloy that does not melt and collapse during surface mount assembly. Similarly, the PATENTS ABSTRACT OF JAPAN JP 59 058843 A, vol. 008, no. 155 (E256), 19th Jul. 1984 discloses a 90% Pb—10% Sn solder alloy that is used to form a stand-off, which is covered with a 63% Sn—37% Pb solder alloy, the stand-off acts as a stopper during reflow of the lower melting point 63% Sn—37%. Pb solder. A solder ball having a core having a relatively high melting temperature and a solder coating having a lower melting temperature is disclosed in International Patent Application WO 9701866 A1 970116.

U.S. Pat. No. 5,466,635, Lynch et al, discloses a method of forming a rigid standoff by electroplating. The concept of a rigid standoff is also disclosed in U.S. Pat. No. 5,468,995 Higgins III and a 'bump electrode' that is attached by a conductive adhesive layer is disclosed in the European Patent Application 0 724 289 A2.

The soldering of a EGA package, complete with attached solder balls, to a substrate is carried out by the reflow method. The solder balls ensure electrical contact between the BGA package and the substrate and also compensates for defects in the flatness of the surfaces to be electrically and mechanically bonded.

One disadvantage of solder balls is that, mechanically they are not very strong, which is due to their composition. As a result these solder balls quickly foul the machinery employed in their manipulation and placement.

Another disadvantage with solder balls relates to the area and geometry of the pads both on the package and the substrate to which the package is to be bonded. These pads set the tolerances relating to the shape, and thus the height, and spacing of the solder balls that are to mechanically and electrically bond the package and the substrate.

Other disadvantages with solder balls is that they are difficult to clean; difficult to desolder; and difficult to inspect for mechanical and electrical defects, such as dry solder joints etc.

OBJECTS & SUMMARY OF THE INVENTION

Accordingly, an object of the present invention is to overcome a disadvantage by reducing the amount and frequency of fouling of the machinery used in manipulation and placement.

Another object of the present invention is to overcome the difficulty in inspect for mechanical and electrical defects, such as dry solder joints etc.

Another object of the present invention is to overcome the other aforementioned disadvantages associated with the solder balls of BGA packages.

Another object of the present invention is to increase the density of the electrical and mechanical attachments between a semiconductor package and a receiving substrate.

Other objects of the present invention are to provide cheaper and lighter elements for making the electrical and mechanical attachment between a semiconductor packages and a receiving substrate.

In order to achieve these objects, the present invention proposes a semiconductor package having an array of solder pads and supportive elements that are mechanically and electrically bonded to said solder pads and that do not collapse during the bonding process, each supportive element having the shape of an hollow cylinder with an axis parallel to the plane of said solder pads.

According to an embodiment of the present invention, the supportive elements have a cross section selected among circular, elliptical, square, rectangular or any combination hereof.

According to another embodiment of the present invention, the supportive elements are conductive and each has an operative mechanical and electrical bond coating.

According to other embodiments of the present invention, the supportive elements are metallic or alloys of copper, brass, aluminum, steel or any combination thereof and the mechanical and electrical bond is achieved by solder.

According to another embodiment of the present invention, the supportive elements are non-conductive and each has an operative mechanical and electrical bond coating.

According to other embodiments of the present invention, the supportive elements are ceramic, glass or a macromolecular polymerized material or any combination thereof and the mechanical and electrical bonding is achieved by an adhesive that contains a metallic powder.

According to another embodiment of the present invention, the mechanical and electrical bonding is achieved by an adhesive that contains silver and/or copper powder in epoxy based glue.

According to another embodiment of the present invention, the adhesive covers part, or the totality, of the surface of the supportive elements.

According to another embodiment of the present invention, a semiconductor package according to the present invention that operatively incorporates an integrated circuit, the semiconductor package being incorporated or used in a system or apparatus.

According to other embodiments of the present invention, the system or apparatus is, or is incorporated within, or that is used in conjunction with, a computer, a domestic and/or consumer appliance (for example a washing machine), a vehicle (for example a motorcar), a telephone and/or a telephone network.

BRIEF DESCRIPTION OF THE DRAWINGS

These and other objects, as well as other advantages and features, of the present invention will become apparent in light of the following detailed description and accompanying drawings among which.

DETAILED DESCRIPTION OF THE INVENTION

Rather than using a solder ball and suffering the disadvantages already described, the present invention proposes the use of supportive elements that are intended to replace the solder balls. These supportive elements, which are substantially rigid, are firstly bonded to a semiconductor package, for example a grid array type semiconductor package. The package, together with its attached supportive elements, can then be bonded to a receiving substrate, for example a printed circuit board (p.c.b.), at a later stage.

These supportive elements have the shape of short hollow cylinders and can be made from a number of different materials.

The hollow cylinders can have various cross section forms such as circular, elliptical, cylindrical, square, rectangular, a rhombus, a polygon or any combination thereof. The forms can be chosen such that they best meet the specific mechanical criteria and various other necessary criteria.

As way of an example regarding the material of the supportive element, the following lists some materials, that are intended to be non-exhaustive examples, that can be employed according to the present invention, these example materials include: elemental metals and metal alloys, such as copper, nickel, aluminum, steel, tin etc.; non-metallic materials such as ceramic, glass, polymerized materials such as Teflon or epoxy resins coated with a conductive material that can be an adhesive; a combination of metallic and non-metallic materials such as copper powder in a epoxy polymerized matrix and metallised non-conductive bulk material. The materials can be chosen such that they best meet the specific electrical, mechanical and thermal criteria and various other criteria such as weight and cost. The choice of a suitable operative material can be readily deduced by those skilled in the art.

Regarding bonding a supportive element to a grid array package, again this can be readily deduced by those skilled in the art. However, by way of some examples according to the present invention, consider the following. If the supportive element is metallic, then it is possible, for example, to operatively cover the supportive element with a material which is easily soldered such as tin and tin alloys, gold and palladium. The supportive element can be covered, for example, with a 10 micrometer layer of brazing cream or tin-rich coating. If the supportive element is non-metallic, then it is necessary to metallise its surface or use a conductive adhesive such as metallic powder in a macromolecular matrix, as for example, copper powder in epoxy glue. In the case where the supportive elements are fabricated from a combination of metallic and non-metallic materials, the choice of bonding material must be made in accordance with the materials and composition of those materials that make up the supportive elements. The choice of such an operative bonding material can be readily deduced by those skilled in the art.

Figure 2:
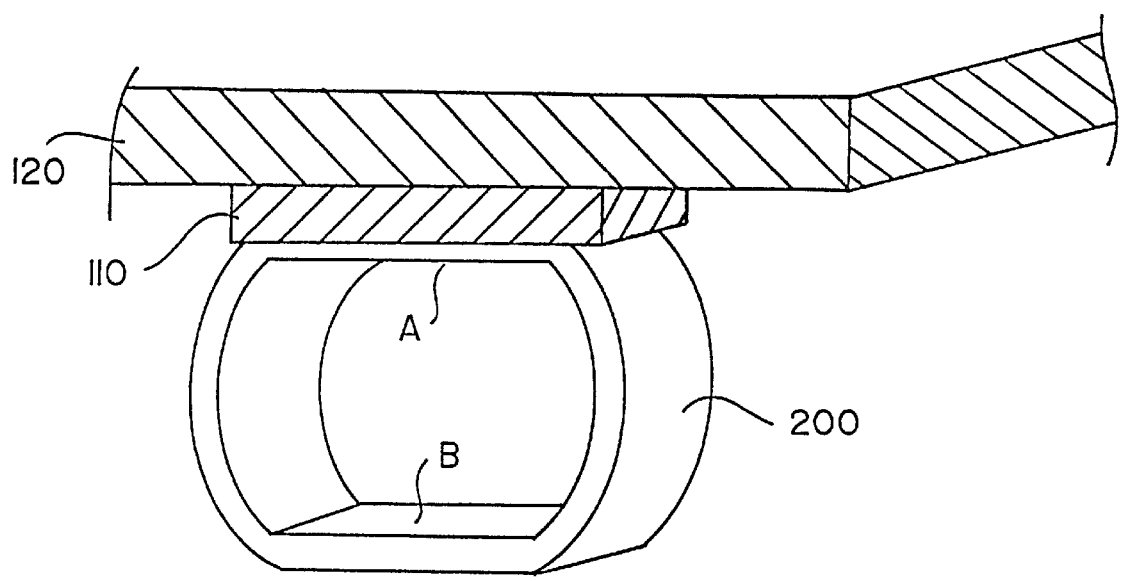
FIG. 2 illustrates a supportive element according to the present invention.

The use of a cylinder as a support element in place of a solder ball is illustrated in FIG. 2. The ring 200 has, in this particular example, two flat sides A and B. The top of side A is attached to a bond or solder pad 110 of the grid array package 120. The bottom of side B is intended to be attached to the bond or solder pad of a receiving substrate (not illustrated).

An advantage of using a flattened ring, as illustrated in FIG. 2, as opposed to a circular ring, is that there is greater stability during bonding, a greater surface area on which to bond to and thus a greater mechanical strength.

According to the present invention, an advantage of using annular, i.e. ringlike or hollow, forms of supporting elements, such as the ring 200 illustrated in FIG. 2, is that it makes the automation, i.e. the manipulation and attachment/detachment, of the supportive elements easier than is currently achieved using solder ball technology. With such supporting elements it is now possible to deal with individual support elements.

Another advantage, according to the present invention, of using hollow forms of supporting elements, such as that illustrated in FIG. 2, is that these support elements can be aligned in an identical manner so as to improve the quality and speed of inspection i.e. in the case of a metallic ring 200, the solder would flow in and around the sides and edges of sides A and B.

Figure 1:
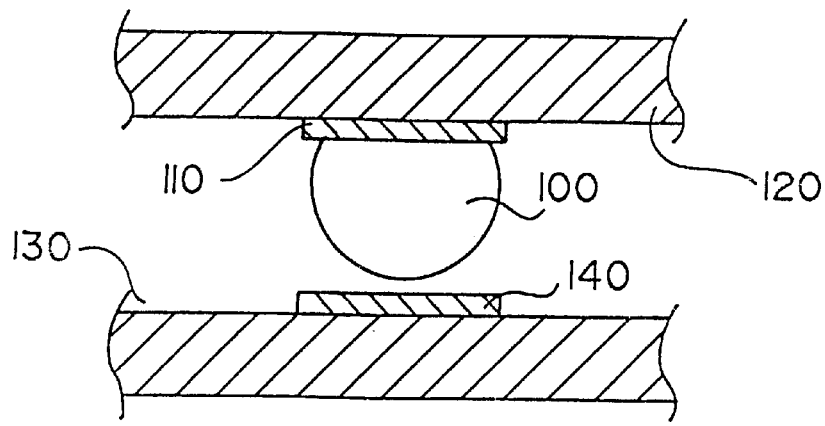
FIG. 1 illustrates an already depicted cross section of part of a BGA package, receiving substrate, and solder ball, as known in the art.
Figure 3:
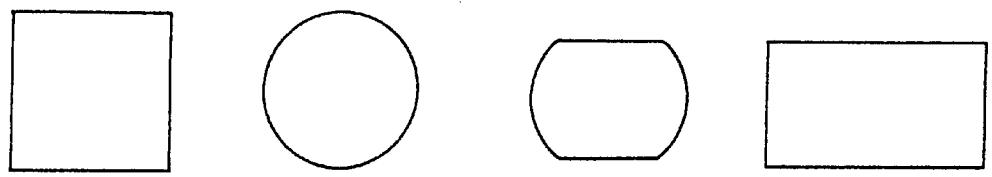
FIG. 3 illustrates exemplary cross sections of supportive elements according to the present invention.
Figure 3:
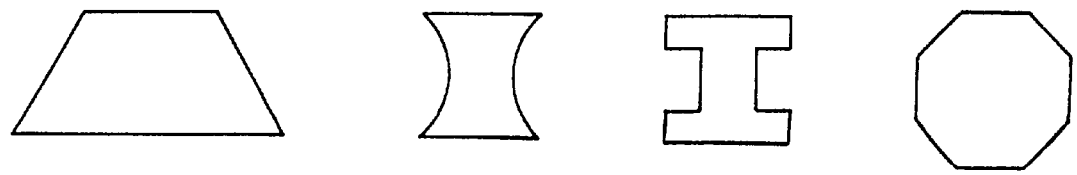

FIG. 3 illustrates examplary outlines of support elements according to the present invention. These forms include a square, a sphere, a rectangle, a rhombus and a hexagon.

It should be understood that the present disclosure is to be considered as an exemplification of the principles of the invention and that there is no intention of limiting the invention to the disclosed embodiments.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

I claim:

1. A semiconductor package having an array of solder pads and supportive elements that are mechanically and electrically bonded to said solder pads and that do not collapse during the bonding process, each supportive element having the shape of an hollow cylinder with an axis parallel to the plane of said solder pads.

2. A semiconductor package according to claim 1, wherein said cylindrical supportive elements have a cross section selected among circular, elliptical, square, rectangular or any combination thereof.

3. A semiconductor package according to claim 1, wherein said supportive elements are conductive and each has an operative mechanical and electrical bond coating.

4. A semiconductor package according to claim 3, wherein said supportive elements are metallic or alloys of copper, brass, aluminum, steel or any combination thereof.

5. A semiconductor package according to claim 3, wherein the mechanical and electrical bond is achieved by solder.

6. A semiconductor package according to claim 1, wherein said supportive elements are non-conductive and each has an operative mechanical and electrical bond coating.

7. A semiconductor package according to claim 6, wherein said supportive elements are ceramic, glass or a macro-molecular polymerized material or any combination thereof.

8. A semiconductor package according to claim 6, wherein mechanical and electrical bonding is achieved by an adhesive that contains a metallic powder.

9. A semiconductor package according to claim 6, wherein mechanical and electrical bonding is achieved by an adhesive that contains silver and/or copper powder in epoxy based glue.

10. A semiconductor package according to claim 8, wherein the adhesive covers part, or the totality, of the surface of said supportive elements.

11. A semiconductor package according to claim 1, further comprising:

an integrated circuit operatively incorporated into said semiconductor package.

12. The semiconductor package of claim 1, wherein the shape of the supportive element is open at at least one end.

13. The semiconductor package of claim 1, wherein the shape of the supportive element is open at both ends.

* * * * *